United States Patent
Shimizu et al.

(10) Patent No.: US 6,488,775 B2
(45) Date of Patent: Dec. 3, 2002

(54) SEMICONDUCTOR-MANUFACTURING DEVICE

(75) Inventors: Akira Shimizu, Tama (JP); Mikio Shimizu, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 09/860,800

(22) Filed: May 18, 2001

(65) Prior Publication Data

US 2002/0017241 A1 Feb. 14, 2002

(30) Foreign Application Priority Data

Jun. 9, 2000 (JP) .......................... 2000-174336

(51) Int. Cl.⁷ .............................................. C23C 16/00
(52) U.S. Cl. ..................................................... 118/715
(58) Field of Search .......................................... 118/715

(56) References Cited

U.S. PATENT DOCUMENTS

| | | | | |
|---|---|---|---|---|
| 4,745,088 A | * | 5/1988 | Inoue ........................ 118/724 |
| 5,020,476 A | * | 6/1991 | Bay ........................... 118/728 |
| 5,288,327 A | * | 2/1994 | Bhat .......................... 118/719 |
| 5,484,484 A | * | 1/1996 | Yamaga ...................... 118/719 |
| 5,669,768 A | * | 9/1997 | Lin ............................ 432/205 |
| 5,683,518 A | * | 11/1997 | Moore ........................ 118/730 |
| 5,828,036 A | * | 10/1998 | Hsue .......................... 118/725 |
| 6,328,221 B1 | * | 12/2001 | Moore ........................ 118/715 |

FOREIGN PATENT DOCUMENTS

| | | | |
|---|---|---|---|
| JP | 63-161611 | * | 7/1988 |
| JP | 63-161612 | * | 7/1988 |

* cited by examiner

*Primary Examiner*—Richard Bueker
(74) *Attorney, Agent, or Firm*—Knobbe, Martens, Olson & Bear, LLP

(57) ABSTRACT

A batch-processing type semiconductor-manufacturing device includes a cylindrical reaction chamber with its upper end closed and its bottom end open, a substrate-supporting boat loading multiple substrates, which are inserted within the reaction chamber, and an injector for spraying a reaction gas to the substrates, which injector is provided parallel to the substrate-supporting boat within the reaction chamber. The injector is supported by an injector holder, and both the injector and the injector holder are fitted by a male-female fitting structure.

3 Claims, 1 Drawing Sheet

SEMICONDUCTOR-MANUFACTURING DEVICE

BACKGROUND OF THE INVENTION

1. Field of the Invention

The present invention relates to a batch-processing type CVD device of the low-pressure vertical model, and particularly relates to a gas injector (hereinafter referred to as "an injector") and a gas injector holder (hereinafter referred to as "an injector holder") within the device.

2. Description of the Related Art

As semiconductor devices have become more highly integrated, reducing a cell area is necessary. In the thin-film forming process, the quality of a film is an important factor for the high integration as well as the homogeneity of film thickness. Particularly in the case of multicomponent thin films (for example, doped-poly Si, SiGe, BST), the homogeneity of the concentration of each constitutive chemical element and doping element has a great influence on the film quality.

Conventionally, an injector has been used to improve the concentration homogeneity of each chemical element in high-productivity batch-processing type CVD devices of the low-pressure vertical model. The injector is to spray a reaction gas to multiple semiconductor substrates at the same time and is fixed within a reaction chamber using a metal injector holder. In this method, however, there is a risk of metal contamination from the injector holder, and it is difficult to employ this method for high-vacuum devices for which high purity is demanded or for processes for next-generation devices.

Additionally conventionally, an injector holder made of SUS (stainless steel) is used to fix an injector made of quartz within the reaction chamber. The injector is fixed by inserting it in the injector holder installed on a gas flange made of SUS (stainless steel). In this method, however, a problem of metal contamination from the injector holder has not been completely solved. For this reason, it is difficult to employ this method for high-vacuum devices for which high purity is demanded or for processes for next-generation devices.

Furthermore, conventionally, to solve the metal contamination problem, an L-shaped integrated injector made of quartz, in which an injector and an injector holder are formed as one, is used. For CVD devices of the typical low-pressure vertical model, the height of a reaction zone is approximately 500 mm. However, the height from a gas inlet to the highest portion of the reaction zone is approximately 1000–1500 mm. In this case, if the angle of the L-shaped portion of the injector deviates by one degree, a gap at the highest portion will become 17–26 mm. Accordingly, when shaping an L-shaped quartz injector by bending, strict accuracy is required, and thus it is not practical to use the L-shaped integrated injector made of quartz for a device which has a small margin between a substrate boat and an inner tube.

Furthermore, for an L-shaped integrated injector made of quartz, because removing a holder portion is necessary when replacing the injector, it takes much care and there is a risk of damaging the injector.

SUMMARY OF THE INVENTION

Consequently, an object of the present invention is to provide an injector which can be used for a device with a small margin between a substrate boat and an inner tube and which is not influenced by the accuracy of processing.

Additionally, another object of the present invention is to provide a semiconductor-manufacturing device, which has an injector in which a problem of metal contamination does not occur.

Furthermore, still another object of the present invention is to provide a semiconductor-manufacturing device, which has an injector wherein an injector can be easily replaced without a risk of damaging the injector.

To achieve the above-mentioned objects, a semiconductor-manufacturing device according to the present invention comprises the following means:

That is, in an embodiment of the present invention, a batch-processing type semiconductor-manufacturing device comprises: (a) a cylindrical reaction chamber with its upper end closed and its bottom end open, (b) a substrate-supporting boat for loading multiple substrates which are inserted within the reaction chamber, (c) an injector for spraying a reaction gas to the substrates, said injector being provided parallel to the substrate-supporting boat within the reaction chamber, and (d) an injector holder for supporting the injector, wherein the injector and the injector holder are detachably joined by a male-female fitting structure.

The fitting structure is preferably made of quartz so that metal contamination can be prevented. However, even if either or both of the male portion and the female portion are made of a metal, the injector can advantageously be detached and replaced. Preferably, the injector has a male end, and the injector holder has a female end. However, the other way around is also feasible. Various male-female fitting structures may be available. Preferably, a ball joint is used.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
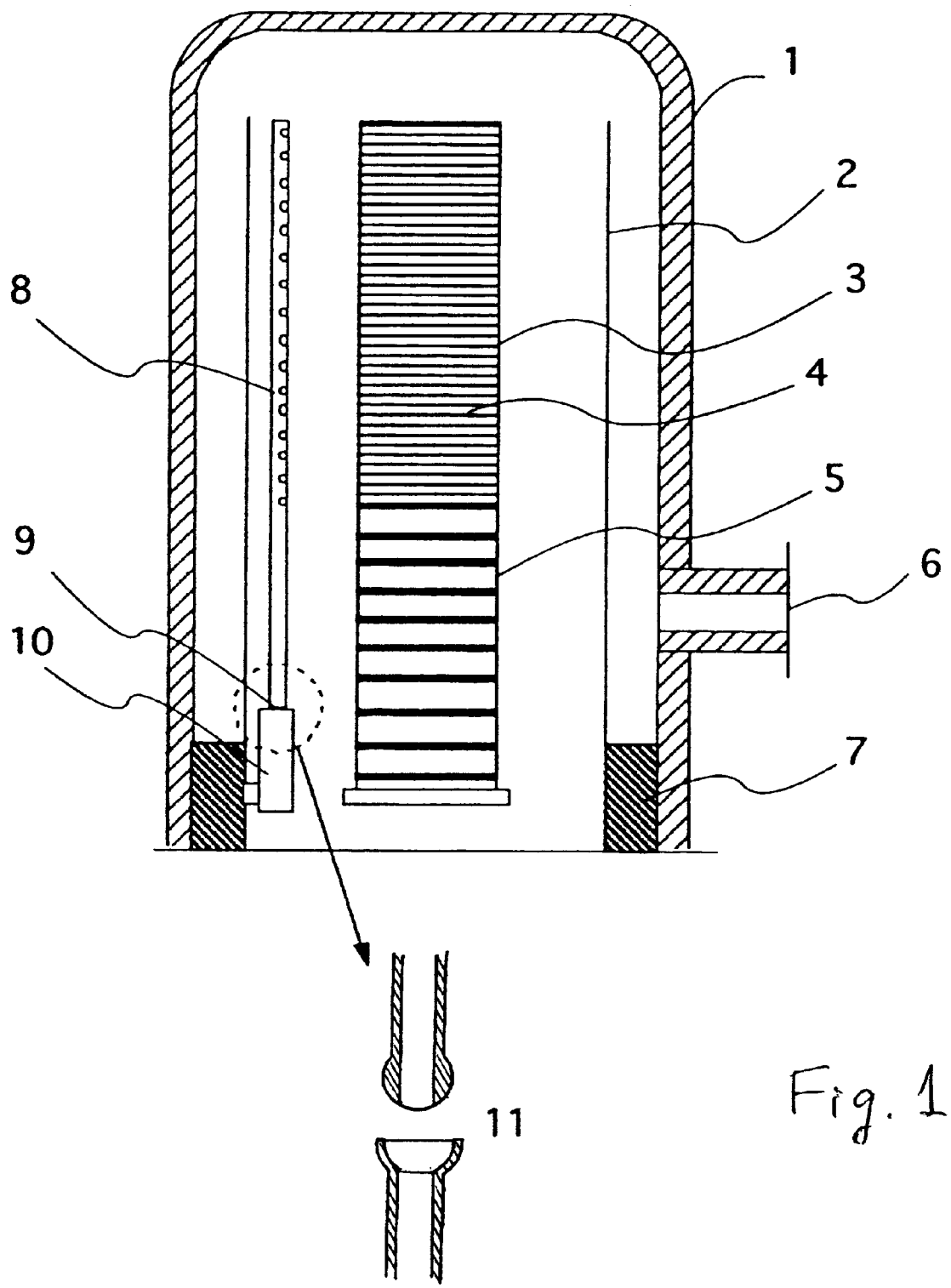
FIG. 1 is a schematic cross section of a preferred embodiment of a reaction chamber according to the present invention.

In the FIGURE, the symbols indicate as follows: 1: Outer tube; 2: Inner tube; 3: Substrate boat; 4: Semiconductor substrate; 5: Boat table; 6: Exhaust port; 7: Gas flange; 8: Injector; 9: Junction; 10: Injector holder; 11: Ball joint

DETAILED DESCRIPTION OF THE PREFERRED EMBODIMENT

The present invention is described below in detail referring to a FIGURE. FIG. 1 is a cross section of a preferred embodiment of a CVD device of the low-pressure vertical model according to the present invention. An outer tube 1 made of quartz forms a cylindrical shape with its upper end closed and its bottom end open. On the side of the outer tube 1 near its bottom end, an exhaust port 6 is provided and is connected to a vacuum pump (not shown). Within the outer tube 1, a cylindrical inner tube 2 is provided with a common shaft to the outer tube 1. At the bottom end of the outer tube I and the inner tube 2, a gas flange 7 is provided. The gas flange 7 is made of SUS (stainless steel), its reaction chamber side is covered by a quartz ring (not shown), and its exposed metal portion is kept to a minimum. A substrate boat 3 is carried within the inner tube 2 and it loads multiple semiconductor substrates 4 at a given pitch. A boat table 5 supports the substrate boat 3 and raises semiconductor substrates 4 to a reaction zone. A heater (not shown) is provided on the outer perimeter of the outer tube 1 to heat semiconductor substrates in the reaction zone.

An injector 8 made of quartz is provided along the interior surface of the inner tube 2 and parallel to the substrate boat 3. On the side of the injector 8, apertures are formed at a given interval and through them a reaction gas is jetted out to the semiconductor substrates 4. The injector 8 is supported by an injector holder 10. The injector holder 10 is made of quartz. The bottom end of the injector 8 is convexly curved in a sphere and the upper end of the injector holder 10 is concavely curved in a sphere. At the junction 9 of the two, the injector 8 and the injector holder 10, a ball joint 11 is formed. This mechanism enables the junction angle of the injector 8 and the injector holder 10 to be adjustable. Additionally, when replacing an injector, only an injector portion can be easily replaced by means of this ball joint.

To increase productivity, preferably 50~150 pieces of semiconductor substrate are batch-processed. For example, if 100 pieces are batch-processed, the pitch between substrates will be 4.76 mm and the height of the substrate boat 3 will be approximately 500 mm. The height of the boat table 5 which supports the substrate boat 3 will be approximately 800 mm. According to this embodiment, the height from the gas flange 7 to the highest portion of the boat table will be approximately 1500 mm. A margin between the inner tube 2 and the substrate boat 3 will be approximately 12 mm. As in this embodiment, even in the case where an injector is 1000 mm or more in height and a margin between the inner tube 2 and the substrate boat 3 is approximately 10 mm, an injector according to the present invention can be used.

[Effects]

By means of an injector according to the present invention, even in a CVD device of the low-pressure vertical model with a small margin between an inner tube and a boat table, the use of a long injector and an injector holder which are made of quartz has become possible regardless of the processing accuracy of the quartz.

Additionally, by means of an injector according to the present invention, by using quartz for both of an injector and an injector holder, metal contamination is eliminated and the use of the injector under high-vacuum conditions and in next-generation processes has become possible.

Furthermore, by means of an injector according to the present invention, replacing only an injector has become possible.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A batch-processing type semiconductor-manufacturing device comprises: (a) a cylindrical reaction chamber with its upper end closed and its bottom end open, (b) a substrate-supporting boat for loading multiple substrates which are arranged vertically within the reaction chamber, (c) an injector for spraying a reaction gas to the substrates, said injector being made of quartz and provided vertically and parallel to the substrate-supporting boat within the reaction chamber, (d) an injector holder for supporting the injector, said injector holder being made of quartz and provided within the reaction chamber, and (e) a gas flange provided at a bottom of the reaction chamber, to which gas flange the injector holder is fixed, wherein the injector and the injector holder are vertically aligned and detachably joined by a ball joint having a male-female fitting structure, and an angle of the injector with respect to the injector holder is adjustable inside the reaction chamber.

2. The batch-processing type semiconductor-manufacturing device according to claim 1, wherein the injector has a male end and the injector holder has a female end.

3. The semiconductor-manufacturing device according to claim 1, wherein the cylindrical reaction chamber is made of quartz.

* * * * *